(12) United States Patent
Jurisch

(10) Patent No.: US 6,377,035 B1
(45) Date of Patent: Apr. 23, 2002

(54) METHOD OF DETECTING AN ABRUPT VARIATION IN AN ELECTRICAL ALTERNATING QUANTITY

(75) Inventor: Andreas Jurisch, Berlin (DE)

(73) Assignee: Siemens AG, Munich (DE)

( * ) Notice: Subject to any disclaimer, the term of this patent is extended or adjusted under 35 U.S.C. 154(b) by 0 days.

(21) Appl. No.: 09/117,596

(22) PCT Filed: Jan. 24, 1997

(86) PCT No.: PCT/DE97/00160

§ 371 Date: Dec. 1, 1998

§ 102(e) Date: Dec. 1, 1998

(87) PCT Pub. No.: WO97/28453

PCT Pub. Date: Aug. 7, 1997

(30) Foreign Application Priority Data

Jan. 31, 1996 (DE) .......................................... 196 05 023

(51) Int. Cl.⁷ ................................................ G01R 23/00
(52) U.S. Cl. .................................. 324/76.19; 324/76.12
(58) Field of Search .......................... 324/76.19, 76.12, 324/605, 607, 613, 614, 615, 616, 617; 364/484, 734.1, 724.1, 724.01, 724.16

(56) References Cited

U.S. PATENT DOCUMENTS

| 4,829,566 | A | * | 5/1989 | Lassaux et al. ............. 379/410 |
| 5,327,137 | A | * | 7/1994 | Scheerer et al. ............ 341/168 |
| 5,717,618 | A | * | 2/1998 | Menkhoff et al. ...... 324/605 X |
| 5,734,577 | A | * | 3/1998 | Chesir et al. ........ 324/76.12 X |

FOREIGN PATENT DOCUMENTS

| EP | 0 224 749 | 6/1987 |
| EP | 0 284 546 | 9/1988 |

* cited by examiner

Primary Examiner—Glenn W. Brown
Assistant Examiner—T. R. Sundaram
(74) Attorney, Agent, or Firm—Kenyon & Kenyon

(57) ABSTRACT

A method of detecting an abrupt variation in a periodic electrical quantity, where a criterion for the occurrence of the abrupt variation is formed from samples of the periodic quantity. To be able to carry out such a method in such a way that the abrupt variations in the periodic quantity can be detected with a high sensitivity, the periodic quantity is weighted in an FIR filter with a transfer function with a double zero position at the nominal frequency; the output signal of the FIR filter is monitored for whether it reaches a threshold indicating that an abrupt variation in the periodic quantity has occurred.

3 Claims, 1 Drawing Sheet

METHOD OF DETECTING AN ABRUPT VARIATION IN AN ELECTRICAL ALTERNATING QUANTITY

FIELD OF THE INVENTION

The present invention relates to a method of detecting an abrupt variation in a periodic electrical quantity wherein a criterion for the occurrence of the abrupt variation is formed from the samples of the periodic quantity. Such a method is used, for example, in power system protection technology to detect the occurrence of a short circuit in an electric power supply system, for example.

BACKGROUND INFORMATION

In a digital feeder protection system (7SA511) manufactured by Siemens AG, an abrupt variation in a periodic electrical quantity is detected by comparing two sampled values of the periodic quantity separated by one period of the periodic quantity. If the deviation is zero, there is no abrupt variation in the periodic quantity. If, however the deviation is not zero, there may be such a variation. According to this method, however, the zero value of the deviation is nevertheless uniform, i.e., it can be achieved without an abrupt variation only when the alternating quantity does not have any signals with frequencies that deviate from their nominal frequency. If this is the case, there is always the risk of a non-steady process being detected with the method, although there is no abrupt variation at all. To avoid faulty detection, a threshold value is set so high that there is no spurious response with the usual deviations in the periodic electrical quantity from the rated frequency. This in turn has the result that, the occurrence of abrupt variations in a periodic quantity can be detected only when there is a great variation.

SUMMARY OF THE INVENTION

Therefore, an object of the present invention is to propose a method of detecting an abrupt variation in a periodic electrical quantity with which such a variation can be detected reliably even when the abrupt variations are relatively small.

To achieve this object, the periodic quantity is weighted in an FIR filter with a transfer function with a double zero position at the nominal frequency not only itself, but also in its first derivation according to time, and the output signal of the FIR filter is monitored to determine whether it reaches a threshold value indicating the occurrence of an abrupt variation in the periodic quantity.

An advantage of the method according to the present invention is that, due to the use of an FIR filter with a double zero position at the nominal frequency, the FIR filter delivers an output signal with a much smaller value than the known method in the case of especially critical periodic quantities in the present context with a relatively minor deviation from the nominal frequency. Therefore, the achievable sensitivity is much greater with the method according to the present invention than with the conventional method.

In an advantageous embodiment of the method according to the present invention, an FIR filter with a transfer function having a zero position at a frequency value of zero is used. Therefore, to further increase the reliability of the method according to the present invention, effects of offset phenomena can be avoided by an analog-digital conversion to the measured result following the sampling.

With an advantageous circuit arrangement for carrying out the method according to the present invention, a comparator is connected to the output end of an FIR filter that receives the periodic electrical quantity at the input and delivers a signal characterizing the abrupt change in the periodic electrical quantity when an output signal of the FIR filter reaches the threshold level. However, it is also readily possible to implement both the FIR filter and the comparator in the form of a data processing system, and to have the method according to the present invention run by means of only the data processing system, if the latter also performs the sampling and the analog-digital conversion of the periodic electrical quantity to be monitored.

DETAILED DESCRIPTION

Figure 1:
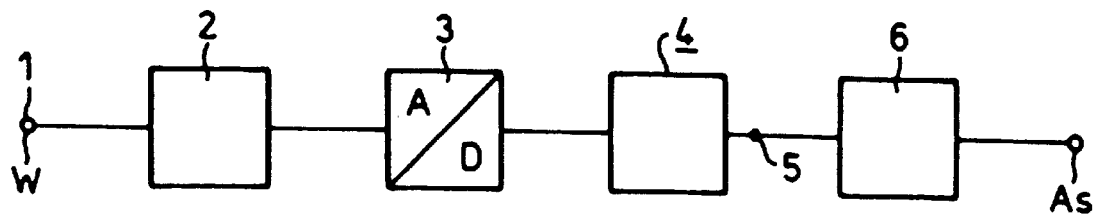
FIG. 1 shows in the form of a block diagram one embodiment of an arrangement for carrying out the method according to the present invention.

A periodic electrical quantity W, which may be, for example, the voltage on a section of line to be monitored in an electric power supply system, is sent to an input 1 of the arrangement shown in FIG. 1. If a fault, such as a short circuit, occurs on the line section to be monitored, then the voltage shows an abrupt variation, from which the occurrence of a fault can be deduced.

To detect abrupt variations in periodic electrical quantity W, it is sampled in a sampling device 2, which is advantageously designed as a sample-and-hold circuit, and sampling occurs once in each half period of periodic electrical quantity W. The samples thus obtained are converted in a downstream analog-digital converter 3 to digital values which are sent to a downstream FIR filter 4. FIR filter 4 has a transfer function like that illustrated in FIG. 2.

Figure 2:
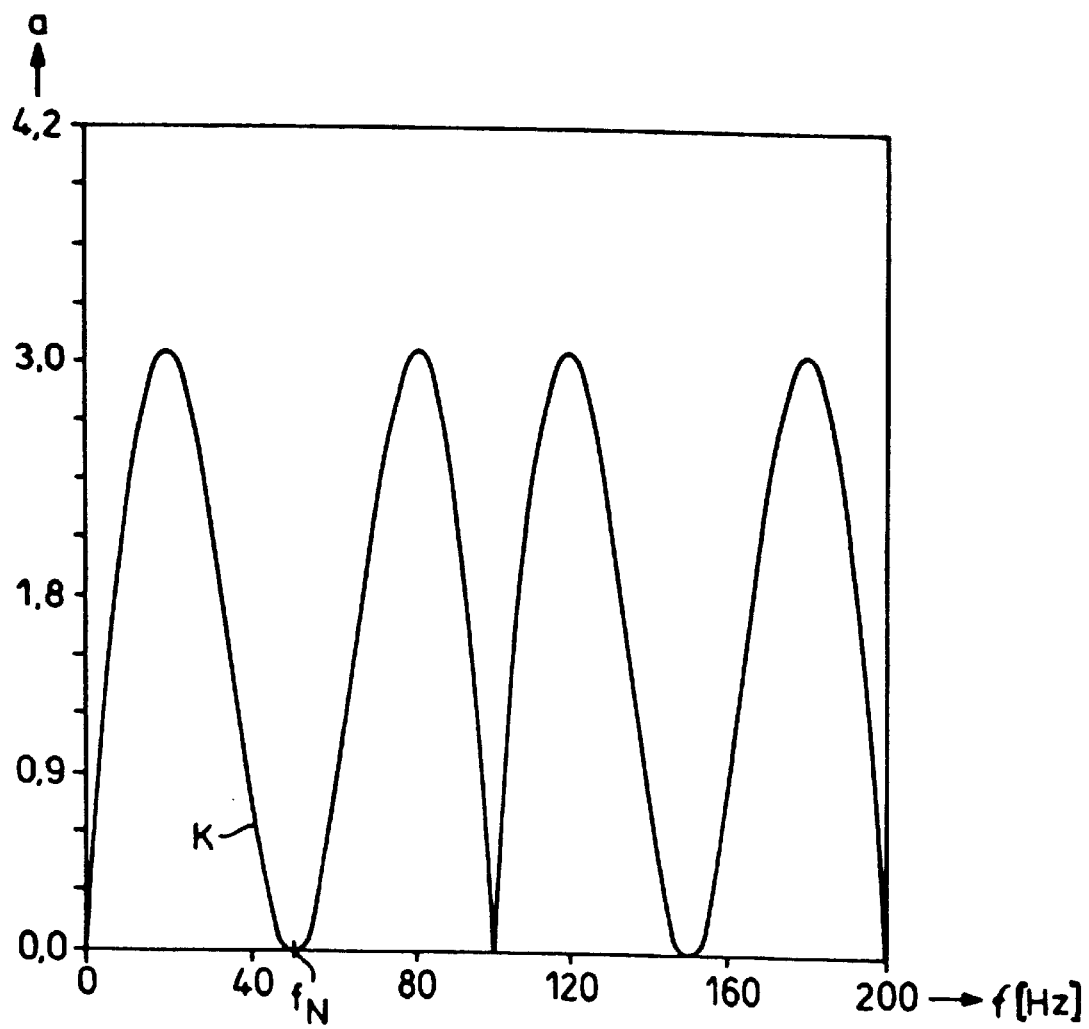
FIG. 2 shows the transfer function of the FIR filter used in the embodiment according to FIG. 1.

Transfer factor a is shown as a function of the frequency in Hz in FIG. 2; curve K shown indicates the curve of the transfer function of FIR filter 4. It can be seen that in the area of nominal frequency $f_N$ of the periodic electrical quantity to be detected (usually 50 Hz in a power supply system), curve K is rounded. This is attributed to the fact that the transfer function is dimensioned so that it has a zero value at nominal frequency $f_N$ and also has a zero value with regard to its time derivation. This leads in an advantageous manner to the fact that a signal with a very small value, which is below the threshold value, occurs at output 5 of the FIR filter when there are frequency fluctuations in periodic electrical quantity W to be monitored about nominal frequency $f_N$. FIR filter 4 has another double zero position at 150 Hz, because this frequency, as the second harmonic, often strongly pronounced, could also interfere with the measurement.

Components of different frequencies formed due to an abrupt variation in periodic electrical quantity W are accurately detected, however, and thus when there is an abrupt variation at output 5 of FIR filter 4, a signal which permits a definite conclusion about the occurrence of an abrupt variation in periodic electrical quantity W is formed, because this signal is greater than the threshold value.

A comparator 6 downstream from FIR filter 4 can therefore be set to a relatively low threshold value, so that an output signal As always occurs at the output of comparator 6, achieving a high sensitivity, only when the periodic electrical quantity W has undergone an abrupt variation.

FIR filter 4 can be described with the following transfer function a(Z), for example:

$$a(Z)=1+Z^{-1}-Z^{-2}-Z^{-3} \quad (1),$$

where z gives the complex operator $Z=e^{j\omega \cdot t_a}$, with $t_a=10$ ms as the sampling interval according to the above example. Equation (2) readily follows from equation (1) with $Z=e^{j\omega \cdot t_a}$:

$$K(j\omega)=1+1^{1-j\omega t_a}-1^{-j2\omega t_a}-1^{-j3\omega t_a} \quad (2).$$

This equation (2) describes the complex transfer factor in the frequency range. Absolute value a of this factor is shown in FIG. 2.

What is claimed is:

1. A method of detecting an abrupt variation in a periodic electrical quantity of an electric power system having a nominal frequency, comprising the steps of:

applying the periodic electrical quantity to an FIR filter;

weighting the periodic electrical quantity in the FIR filter with a transfer function to generate an output signal, the transfer function having a value of zero at a double zero position at the nominal frequency of the electrical power system; and monitoring the output signal of the FIR filter to determine if the output signal reaches a threshold value, the threshold value indicating an occurrence of the abrupt variation in the periodic electrical quantity.

2. The method according to claim 1, wherein the transfer function also has an additional zero position at a zero frequency.

3. A circuit arrangement for detecting an abrupt variation in a periodic electrical quantity of an electrical power system having a nominal frequency, comprising:

an FIR filter having an input and an output, the FIR filter having a transfer function with a value of zero as a double zero at a position of the nominal frequency of the electrical power system, the input of the FIR filter receiving the periodic electrical quantity, and a comparator coupled to the output of the FIR filter and generating an output signal, the output signal indicating the abrupt variation when the output of the FIR filter reaches a threshold value.

* * * * *